(12) United States Patent
Tsuji et al.

(10) Patent No.: US 11,391,764 B2
(45) Date of Patent: Jul. 19, 2022

(54) CAPACITANCE SENSOR

(71) Applicant: AISIN CORPORATION, Aichi (JP)

(72) Inventors: Haruki Tsuji, Kariya (JP); Takaaki Koizumi, Kariya (JP); Saya Kobayashi, Kariya (JP)

(73) Assignee: AISIN CORPORATION, Aichi (JP)

( * ) Notice: Subject to any disclaimer, the term of this patent is extended or adjusted under 35 U.S.C. 154(b) by 52 days.

(21) Appl. No.: 17/104,066

(22) Filed: Nov. 25, 2020

(65) Prior Publication Data

US 2021/0165028 A1 Jun. 3, 2021

(30) Foreign Application Priority Data

Dec. 2, 2019 (JP) .............................. JP2019-217709

(51) Int. Cl.
*G01R 27/26* (2006.01)
*G01N 27/07* (2006.01)

(52) U.S. Cl.
CPC ......... *G01R 27/2605* (2013.01); *G01N 27/07* (2013.01)

(58) Field of Classification Search
CPC ........ G01R 27/00; G01R 27/02; G01R 27/26; G01R 27/2605; G01N 27/00; G01N 27/02; G01N 27/04; G01N 27/06; G01N 27/07; G01D 5/00; G01D 5/12; G01D 5/14; G01D 5/24; H03K 17/00; H03K 17/94; H03K 17/945; H03K 17/955; H03K 2217/00; H03K 2217/94; H03K 2217/96; H03K 2217/9607; H03K 2217/960705; H01H 36/00

USPC ....... 324/600, 649, 658, 661, 662, 663, 671, 324/686, 76.11, 126; 345/173, 175; 702/47, 52

See application file for complete search history.

(56) References Cited

U.S. PATENT DOCUMENTS

| 4,352,090 | A | * | 9/1982 | Ohama ..................... B60Q 1/52 340/563 |
| 9,105,255 | B2 | * | 8/2015 | Brown ................. G09G 3/3696 |
| 11,231,810 | B2 | * | 1/2022 | Kim ....................... G06F 3/0446 |
| 2008/0316182 | A1 | * | 12/2008 | Antila ..................... G06F 3/045 178/18.05 |

(Continued)

FOREIGN PATENT DOCUMENTS

| JP | 2017-048640 A | 3/2017 |
| JP | 2018-067423 A | 4/2018 |

*Primary Examiner* — Hoai-An D. Nguyen
(74) *Attorney, Agent, or Firm* — Oblon, McClelland, Maier & Neustadt, L.L.P.

(57) ABSTRACT

A capacitance sensor detects proximity of a detection object based on changes in capacitances between the detection object and a first detection electrode and between the detection object and a second detection electrode. The capacitance sensor includes: a capacitor applied with a first potential; a first switch provided over terminals of the capacitor; a second switch connected to the capacitor; a third switch connected to the second switch and the first detection electrode, and applied with a second potential; a fourth switch connected to the capacitor; a fifth switch connectable to the second detection electrode and connected to the fourth switch, and applied with the second potential; and a determination unit determining a failure of the first detection electrode based on a potential difference between a potential of the terminal of the capacitor and a reference potential.

9 Claims, 3 Drawing Sheets

(56) References Cited

U.S. PATENT DOCUMENTS

2013/0016061 A1* 1/2013 Souchkov ........... G06F 3/04166
345/174
2018/0238095 A1 8/2018 Nagao et al.

* cited by examiner

FIG.3

|  | STEP #1 | STEP #2 (DETECTION OF SHORT-CIRCUITED STATE) | | | STEP #3 (DETECTION OF OPEN STATE) | | |
|---|---|---|---|---|---|---|---|
|  | (STATE OF SWITCH) | (STATE OF SWITCH) | (DETERMINATION STANDARD) | (DETERMINATION RESULT) | (DETECTION OF OPEN STATE) | (DETERMINATION STANDARD) | (DETERMINATION RESULT) |
| FIRST DETECTION ELECTRODE | FIRST SWITCH: CLOSED STATE | SECOND SWITCH: CLOSED STATE | Vcs<Vr | NOT IN SHORT-CIRCUITED STATE | SECOND SWITCH: CLOSED STATE | Vcs>Vr | NOT IN OPEN STATE |
|  |  | FIFTH SWITCH: OPEN STATE | Vcs>Vr | IN SHORT-CIRCUITED STATE | FIFTH SWITCH: CLOSED STATE | Vcs<Vr | IN OPEN STATE |
| SECOND DETECTION ELECTRODE | FIRST SWITCH: CLOSED STATE | THIRD SWITCH: OPEN STATE | Vcs<Vr | NOT IN SHORT-CIRCUITED STATE | THIRD SWITCH: CLOSED STATE | Vcs>Vr | NOT IN OPEN STATE |
|  |  | FOURTH SWITCH: CLOSED STATE | Vcs>Vr | IN SHORT-CIRCUITED STATE | FOURTH SWITCH: CLOSED STATE | Vcs<Vr | IN OPEN STATE |

CAPACITANCE SENSOR

CROSS REFERENCE TO RELATED APPLICATIONS

This application is based on and claims priority under 35 U.S.C. § 119 to Japanese Patent Application 2019-217709, filed on Dec. 2, 2019, the entire content of which is incorporated herein by reference.

TECHNICAL FIELD

This disclosure relates to a capacitance sensor that detects proximity of a detection object based on a change in a capacitance.

BACKGROUND DISCUSSION

In the related art, a capacitance sensor that detects proximity of a detection object has been used. A capacitance sensor may include, for example, a detection electrode that performs capacitive coupling with a detection object, and the capacitance sensor detects the proximity of the detection object based on a change in a capacitance. In such a capacitance sensor, if the detection electrode or a wire connecting the detection electrode is in a short-circuited state or an open state, the proximity of the detection object cannot be detected appropriately, and therefore techniques for diagnosing failures have been studied (for example, JP 2018-67423A (Reference 1) and JP 2017-48640A (Reference 2)).

Reference 1 discloses a grip sensor that detects gripping on an object by a hand. The grip sensor includes a grip detection electrode, a disconnection determination electrode disposed near a first end, a disconnection determination electrode disposed near a second end, and a switch that switches a state of the disconnection determination electrode between grounded and non-grounded, so as to determine presence or absence of disconnection of the grip detection electrode based on a change in a capacitance of the grip detection electrode when the state of the disconnection determination electrode is switched from non-grounded to grounded.

Reference 2 discloses an opening and closing member control device in which a detection signal output from a capacitance type sensor electrode provided at an end portion of an opening and closing member is compared with a pinch determination threshold to determine whether an object is pinched by the opening and closing member in operation, and when pinching is detected, the opening and closing member in operation is reversed or stopped. The opening and closing member control device includes an opening and closing position detection unit that detects an opening and closing position of the opening and closing member, and a disconnection determination unit that determines, based on the detection signal of the sensor electrode and a disconnection threshold used for determining whether the sensor electrode is disconnected, whether the sensor electrode is disconnected. The disconnection determination unit determines whether there is disconnection using the disconnection threshold when the opening and closing member is located in a region where the pinch determination is not performed.

In the technique described in Reference 1, a switch that is not used for grip detection is required to determine whether the grip detection electrode is disconnected. Therefore, the technique described in Reference 1 has room for improvement due to an increase in manufacturing cost and mounting space caused by an increase in components. Further, in the technique described in Reference 2, when determining whether the sensor electrode is disconnected, the opening and closing member needs to be located in a region where the pinching determination is not performed, and there is room for improving convenience.

A need thus exists for a capacitance sensor which is not susceptible to the drawback mentioned above.

SUMMARY

A characteristic configuration of a capacitance sensor according to this disclosure resides in that the capacitance sensor is configured to detect proximity of a detection object based on a change in a capacitance between the detection object and a first detection electrode and a change in a capacitance between the detection object and a second detection electrode, the capacitance sensor including: a capacitor whose one terminal is applied with a preset first potential; a first switch provided over the one terminal and the other terminal of the capacitor; a second switch whose one terminal is connected to the other terminal of the capacitor; a third switch whose one terminal is connected to the other terminal of the second switch and the first detection electrode, and the other terminal is applied with a second potential lower than the first potential; a fourth switch whose one terminal is connected to the other terminal of the capacitor; a fifth switch whose one terminal is connectable to the second detection electrode and is connected to the other terminal of the fourth switch, and the other terminal is applied with the second potential; and a determination unit configured to determine a failure of at least the first detection electrode based on a potential difference between a potential of the other terminal of the capacitor and a reference potential set according to the first potential.

BRIEF DESCRIPTION OF THE DRAWINGS

The foregoing and additional features and characteristics of this disclosure will become more apparent from the following detailed description considered with the reference to the accompanying drawings, wherein:

FIG. 3 is a diagram showing processing and a determination standard of failure determination.

DETAILED DESCRIPTION

A capacitance sensor disclosed here is configured to detect proximity of a detection object based on a change in a capacitance between the detection object and a first detection electrode and a change in a capacitance between the detection object and a second detection electrode, such that failure determination can be performed without providing new components. Hereinafter, a capacitance sensor 1 of the present embodiment will be described.

Figure 1:
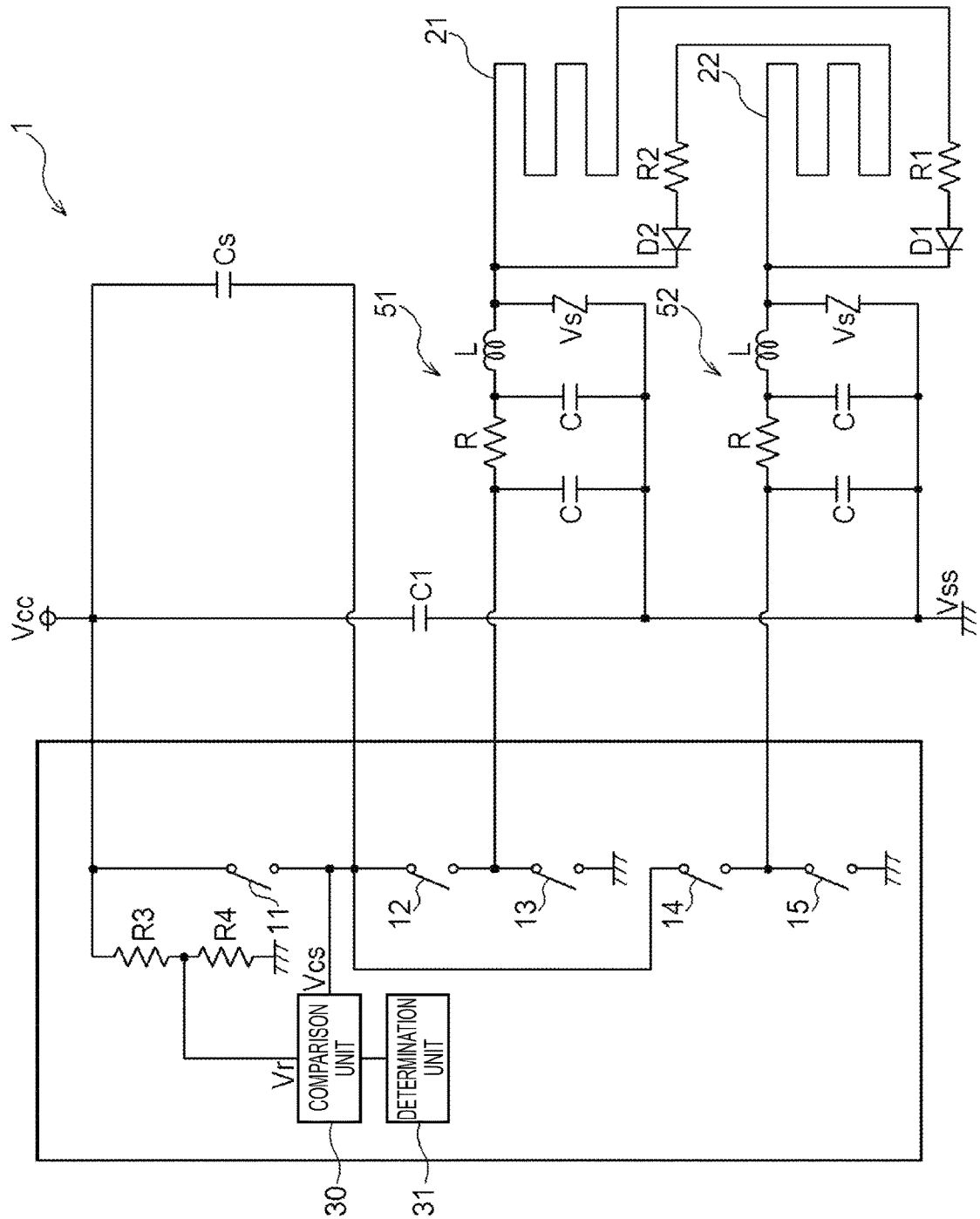
FIG. 1 is a diagram showing a configuration of a capacitance sensor.

FIG. 1 is a diagram showing a configuration of the capacitance sensor 1. The capacitance sensor 1 of the present embodiment includes a capacitor Cs, a first switch 11, a second switch 12, a third switch 13, a fourth switch 14, a fifth switch 15, a first detection electrode 21, a second detection electrode 22, a comparison unit 30, and a determination unit 31.

A preset first potential is applied to one terminal of the capacitor Cs. The capacitors Cs is used both when a detection object is to be detected and when a failure is to be determined. The capacitor Cs includes a pair of terminals, and the first potential, which is a constant voltage, is applied to the one terminal. In the present embodiment, the first potential is shown as Vcc. In order to reduce fluctuation (ripple voltage) of the first potential, a smoothing capacitor C1 is provided between the pair of terminals of the capacitor Cs and a ground potential.

The first switch 11 is provided over the one terminal and the other terminal of the capacitor Cs. The one terminal and the other terminal of the capacitor Cs are the pair of terminals of the capacitor Cs described above. The phrase "provided over the one terminal and the other terminal" means that one terminal of the first switch 11 and the one terminal of the capacitor Cs are electrically connected to each other, and the other terminal of the first switch 11 and the other terminal of the capacitor Cs are electrically connected to each other. Therefore, when the first switch 11 is in an open state, the capacitor Cs is charged at the first potential Vcc, and when the first switch 11 is in a closed state, electric charge stored in the capacitor Cs is discharged.

The second switch 12 includes a pair of terminals. One terminal of the second switch 12 is connected to the other terminal of the capacitor Cs. The other terminal of the capacitor Cs is a terminal, of the pair of terminals of the capacitor Cs, on a side to which the first potential Vcc is not applied. Therefore, the one terminal of the pair of terminals of the second switch 12 is electrically connected to the terminal, of the pair of terminals of the capacitor Cs, on the side to which the first potential Vcc is not applied.

The third switch 13 includes a pair of terminals. One terminal of the third switch 13 is connected to the other terminal of the second switch 12 and the first detection electrode 21, and the other terminal of the third switch 13 is applied with a second potential Vss lower than the first potential Vcc. The other terminal of the second switch 12 is a terminal, of the pair of terminals of the second switch 12, on a side not connected to the capacitor Cs. The first detection electrode 21 is an electrode that performs capacitive coupling with the detection object. Further, the second potential Vss lower than the first potential Vcc is the ground potential in the present embodiment. Therefore, the one terminal of the pair of terminals of the third switch 13 is electrically connected to the terminal, of the pair of terminals of the second switch 12, on the side not connected to the capacitor Cs and to an electrode that performs capacitive coupling with the detection object, and the other terminal of the pair of terminals of the third switch 13 is applied with the ground potential. In the present embodiment, a filter unit 51 including a resistor R, capacitors C, a coil L, and a varistor Vs is provided between the one terminal of the third switch 13 and the first detection electrode 21.

The fourth switch 14 includes a pair of terminals. One terminal of the fourth switch 14 is connected to the other terminal of the capacitor Cs. The other terminal of the capacitor Cs is a terminal, of the pair of terminals of the capacitor Cs, on the side to which the first potential Vcc is not applied. Therefore, the one terminal of the pair of terminals of the fourth switch 14 is electrically connected to the terminal, of the pair of terminals of the capacitor Cs, on the side to which the first potential Vcc is not applied.

The fifth switch 15 includes a pair of terminals. One terminal of the fifth switch 15 can be connected to the second detection electrode 22 and connected to the other terminal of the fourth switch 14, and the other terminal of the fifth switch 15 is applied with the second potential Vss. The second detection electrode 22 is an electrode that performs capacitive coupling with the detection object. The phrase "can be connected to" means that when the capacitance sensor 1 detects the detection object, the detection object may be detected by only the first detection electrode 21, or the detection object may be detected by both the first detection electrode 21 and the second detection electrode 22. Therefore, the second detection electrode 22 may not be provided. In the present embodiment, an example in which the second detection electrode 22 is provided is shown. The other terminal of the fourth switch 14 is a terminal, of the pair of terminals of the fourth switch 14, on a side not connected to the capacitor Cs. Further, the second potential Vss is the ground potential in the present embodiment. Therefore, the one terminal of the pair of terminals of the fifth switch 15 is electrically connected to the terminal, of the pair of terminals of the fourth switch 14, on the side not connected to the capacitor Cs and to an electrode, which is different from the first detection electrode 21 and performs capacitive coupling with the detection object, and the other terminal of the pair of terminals of the fifth switch 15 is applied with the ground potential. In the present embodiment, a filter unit 52 including the resistor R, the capacitors C, the coil L, and the varistor Vs is provided between the one terminal of the fifth switch 15 and the second detection electrode 22.

Here, in the present embodiment, the first detection electrode 21 is electrically connected to the filter unit 52 via a resistor R1 and a diode D1. Therefore, the first detection electrode 21 can be grounded via the resistor R1, the diode D1, the coil L of the filter unit 52, the resistor R, and the fifth switch 15. Further, the second detection electrode 22 is electrically connected to the filter unit 51 via a resistor R2 and a diode D2. Therefore, the second detection electrode 22 can be grounded via the resistor R2, the diode D2, the coil L of the filter unit 51, the resistor R, and the third switch 13.

The comparison unit 30 compares a magnitude relationship between a potential of the other terminal of the capacitor Cs and a reference potential Vr set according to the first potential Vcc. Therefore, one terminal of a pair of input terminals of the comparison unit 30 is electrically connected to the terminal, of the pair of terminals of the capacitor Cs, on the side to which the first potential Vcc is not applied (a potential of a connected node is Vcs), and the other terminal of the pair of input terminals of the comparison unit 30 is applied with a potential obtained by dividing the first potential Vcc by two resistors R3, R4 having a predetermined resistance value (the applied potential is Vr). In the present embodiment, a potential of ½ of the first potential Vcc is applied to the other terminal of the pair of input terminals of the comparison unit 30.

The determination unit 31 determines a failure of at least the first detection electrode 21 based on a potential difference between the potential of the other terminal of the capacitor Cs and the reference potential Vr set according to the first potential Vcc. The potential difference between the potential of the other terminal of the capacitor Cs and the reference potential set according to the first potential Vcc is a magnitude relationship between the potential of the other terminal of the capacitor Cs and the reference potential set according to the first potential Vcc in the present embodiment, and is compared by the comparison unit 30. Therefore, the determination unit 31 determines whether a failure occurs in the first detection electrode 21 according to a comparison result of the comparison unit 30. Here, in the present embodiment, the second detection electrode 22 is also provided. Therefore, the determination unit 31 determines whether a failure occurs in the first detection electrode 21 or the second detection electrode 22.

Figure 2:
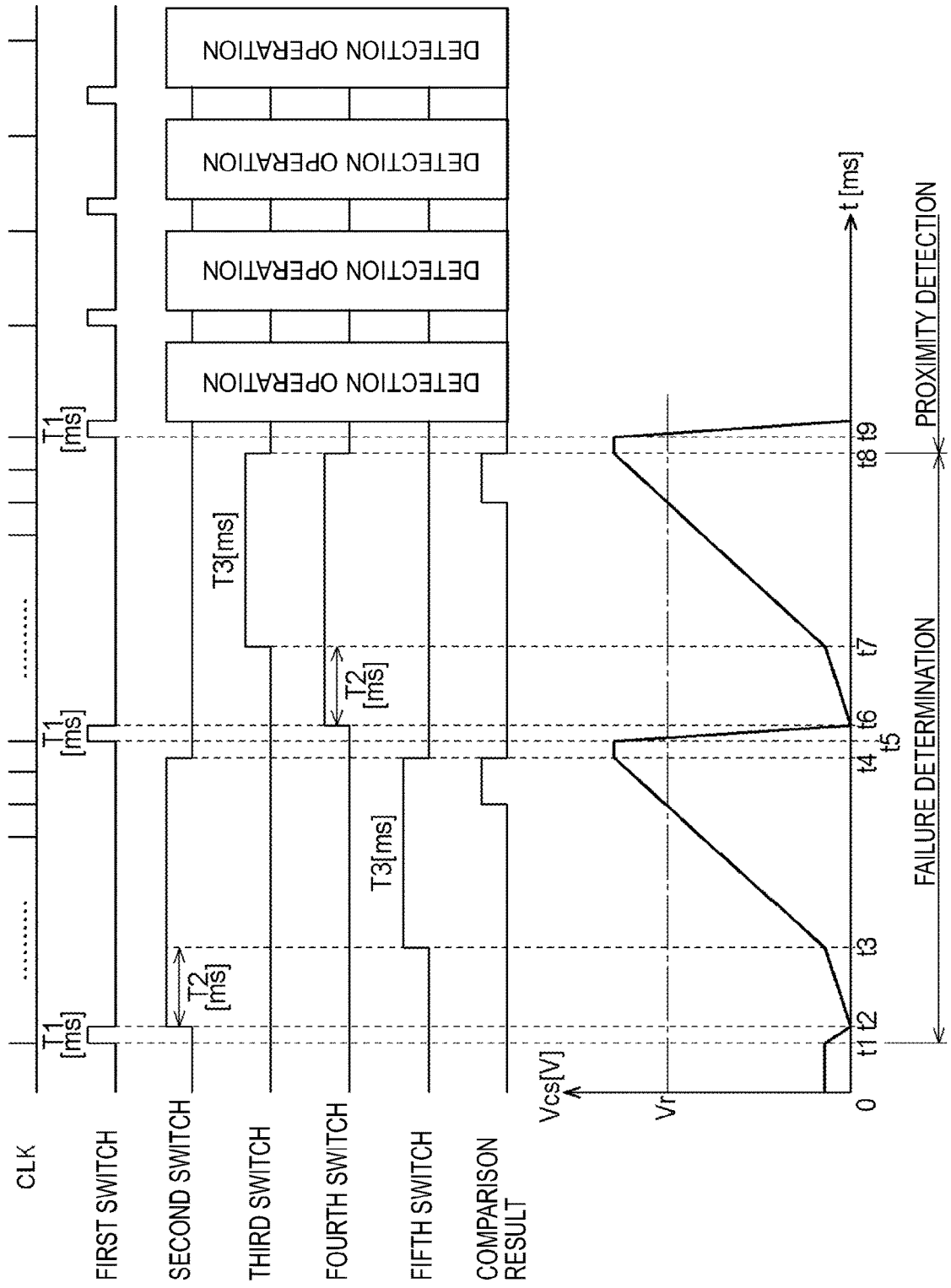
FIG. 2 is a time chart showing an operation of the capacitance sensor.

Failure determination by the determination unit 31 will be described below. FIG. 2 shows a time chart showing an operation of the capacitance sensor 1. As shown in FIG. 2, the failure determination is performed before proximity detection in which the capacitance sensor 1 detects the proximity of the detection object. For example, it is preferable to perform the failure determination at the start of energization of the capacitance sensor 1. As shown in FIG. 2, the failure determination and the proximity detection are performed based on a CLK signal that counts a predetermined time.

When the capacitance sensor 1 is energized (before t1), the first switch 11, the second switch 12, the third switch 13, the fourth switch 14, and the fifth switch 15 are in the open state. At this time, electric charge is stored in the capacitor Cs. When the determination unit 31 performs the failure determination, first, the first switch 11 is closed for a predetermined time. The time during which the first switch 11 is closed (the above-described "predetermined time") is preferably set longer than the time until the electric charge stored in the capacitor Cs is discharged. In an example of FIG. 2, the first switch 11 is closed for a period (T1 [milliseconds]) from t1 to t2, so that the potential of the other terminal of the capacitor Cs becomes a predetermined value or less (close to zero). Here, in the following, for ease of understanding, the potential of the other terminal of the capacitor Cs is assumed to be the Vcs.

After the first switch 11 is closed and the Vcs becomes equal to or less than the predetermined value, the determination unit 31 opens the first switch 11, and then the determination unit 31 closes the second switch 12 while the fifth switch 15 is in the open state. In the example of FIG. 2, the fifth switch 15 is opened and the second switch 12 is closed for a period (T2 [milliseconds]) from t2 to t3. The determination unit 31 determines whether the first detection electrode 21 is in a short-circuited state based on the potential Vcs of the other terminal of the capacitor Cs at this time. That is, if the first detection electrode 21 is in the short-circuited state, the Vcs rises when the second switch 12 is closed. At this time, when the Vcs rises to the reference potential Vr set as a determination threshold, the determination unit 31 determines that the first detection electrode 21 is in the short-circuited state. On the other hand, if the first detection electrode 21 is not in the short-circuited state, as shown in FIG. 2, the Vcs does not rise significantly even when the second switch 12 is closed. Therefore, when the Vcs does not rise to the reference potential Vr, which is the determination threshold, the determination unit 31 determines that the first detection electrode 21 is not in the short-circuited state.

Next, the determination unit 31 closes both the second switch 12 and the fifth switch 15. In the example of FIG. 2, both the second switch 12 and the fifth switch 15 are closed for a period (T3 [milliseconds]) from t3 to t4. The determination unit 31 determines whether the first detection electrode 21 is in an open state based on the potential Vcs of the other terminal of the capacitor Cs at this time. That is, if the first detection electrode 21 is in the open state, the Vcs does not rise even when the second switch 12 and the fifth switch 15 are in the closed state. Therefore, at this time, if the Vcs does not rise to the reference potential Vr set as the determination threshold, the determination unit 31 determines that the first detection electrode 21 is in the open state. On the other hand, if the first detection electrode 21 is not in the open state, the Vcs rises significantly when the second switch 12 and the fifth switch 15 are in the closed state. Therefore, as shown in FIG. 2, when the Vcs rises to the reference potential Vr, which is the determination threshold, the determination unit 31 determines that the first detection electrode 21 is not in the open state.

Further, when the second detection electrode 22 is connected to the one terminal of the fifth switch 15 as in the present embodiment, it is also possible to perform the failure determination on the second detection electrode 22, and when the failure determination on the second detection electrode 22 is performed, the determination unit 31 closes the first switch 11 for a predetermined time. In the example of FIG. 2, the first switch 11 is closed for a period (T1 [milliseconds]) from t5 to t6, so that the Vcs becomes zero.

After the first switch 11 is closed and the Vcs becomes equal to or less than the predetermined value, the determination unit 31 opens the first switch 11, and then the determination unit 31 closes the fourth switch 14 while the third switch 13 is in the open state. In the example of FIG. 2, the third switch 13 is opened and the fourth switch 14 is closed for a period (T2 [milliseconds]) from t6 to t7. The determination unit 31 determines whether the second detection electrode 22 is in a short-circuited state based on the potential Vcs of the other terminal of the capacitor Cs at this time. That is, if the second detection electrode 22 is in the short-circuited state, the Vcs rises when the fourth switch 14 is closed. At this time, when the Vcs rises to the reference potential Vr set as the determination threshold, the determination unit 31 determines that the second detection electrode 22 is in the short-circuited state. On the other hand, if the second detection electrode 22 is not in the short-circuited state, as shown in FIG. 2, the Vcs does not rise significantly even when the fourth switch 14 is closed. Therefore, when the Vcs does not rise to the reference potential Vr, which is the determination threshold, the determination unit 31 determines that the second detection electrode 22 is not in the short-circuited state.

Next, the determination unit 31 closes both the third switch 13 and the fourth switch 14. In the example of FIG. 2, both the third switch 13 and the fourth switch 14 are closed for a period (T3 [milliseconds]) from t7 to t8. The determination unit 31 determines whether the second detection electrode 22 is in an open state based on the potential Vcs of the other terminal of the capacitor Cs at this time. That is, if the second detection electrode 22 is in the open state, the Vcs does not rise even when the third switch 13 and the fourth switch 14 are in the closed state. Therefore, at this time, if the Vcs does not rise to the reference potential Vr set as the determination threshold, the determination unit 31 determines that the second detection electrode 22 is in the open state. On the other hand, if the second detection electrode 22 is not in the open state, the Vcs rises significantly when the third switch 13 and the fourth switch 14 are in the closed state. Therefore, as shown in FIG. 2, when the Vcs rises to the reference potential Vr, which is the determination threshold, the determination unit 31 determines that the second detection electrode 22 is not in the open state. FIG. 2 also shows output (a comparison result) of the comparison unit 30 used by the determination unit 31 for the failure determination, that is, output when the Vcs exceeds the reference potential Vr.

FIG. 3 shows processing and a determination standard of the above-described failure determination according to the present embodiment. In FIG. 3, switches not shown are in the open state. In the failure determination of the first detection electrode 21, the first switch 11 is closed for a predetermined time, and the capacitor Cs is discharged (step #1). When the first switch 11 is opened, the second switch 12 is closed and the fifth switch 15 is opened (step #2). At this time, if the Vcs is smaller than the reference potential Vr, it is determined that the first detection electrode 21 is not in the short-circuited state, and if the Vcs is larger than the reference potential Vr, it is determined that the first detection electrode 21 is in the short-circuited state. Subsequently, the second switch 12 and the fifth switch 15 are closed (step #3). At this time, if the Vcs is larger than the reference potential Vr, it is determined that the first detection electrode 21 is not in the open state, and if the Vcs is smaller than the reference potential Vr, it is determined that the first detection electrode 21 is in the open state.

For the second detection electrode 22, the first switch 11 is closed for a predetermined time, and the capacitor Cs is discharged (step #1). When the first switch 11 is opened, the third switch 13 is opened and the fourth switch 14 is closed (step #2). At this time, if the Vcs is smaller than the reference potential Vr, it is determined that the second detection electrode 22 is not in the short-circuited state, and if the Vcs is larger than the reference potential Vr, it is determined that the second detection electrode 22 is in the short-circuited state. Subsequently, the third switch 13 and the fourth switch 14 are closed (step #3). At this time, if the Vcs is larger than the reference potential Vr, it is determined that the second detection electrode 22 is not in the open state, and if the Vcs is smaller than the reference potential Vr, it is determined that the second detection electrode 22 is in the open state.

As described above, the present capacitance sensor 1 performs failure determination. In such a failure determination, the failure determination is performed by using the originally provided switches instead of providing switches for the failure determination. That is, in the failure determination of the first detection electrode 21, the failure determination is performed by using the second switch 12 used for detecting the detection object by the first detection electrode 21 and the fifth switch 15 used for detecting the detection object by the second detection electrode 22. Further, in the failure determination of the second detection electrode 22, the failure determination is performed by using the fourth switch 14 used for detecting the detection object by the second detection electrode 22 and the third switch 13 used for detecting the detection object by the first detection electrode 21. Therefore, cost related to the failure determination does not increase, and control related to the failure determination is easy and convenient.

After the failure determination of the first detection electrode 21 and the second detection electrode 22 is performed, that is, when it is determined that the first detection electrode 21 and the second detection electrode 22 have not failed, the capacitance sensor 1 starts detecting the detection object. Since the detection of the detection object by the capacitance sensor 1 is known, the detailed description thereof will be omitted, and the detection is shown as "detection operations" in t9 and thereafter in FIG. 2. For example, for the first detection electrode 21, after a first operation, in which the first switch 11 is closed for a predetermined time and then opened (in FIG. 2, correspond to an operation of the first switch 11 immediately before each "detection operation"), is performed, a second operation, in which the second switch 12 is opened and then closed and further opened, and a third operation, in which the third switch 13 is opened and then closed and further opened, are alternately repeated to detect a capacitance of the first detection electrode 21 (the first operation is not repeated, and the second operation and the third operation are alternately repeated), that is, whether the detection object is in proximity is determined based on a value of the Vcs at this time. Further, similarly for the second detection electrode 22, after the first operation, in which the first switch 11 is closed for a predetermined time and then opened (in FIG. 2, correspond to the operation of the first switch 11 immediately before each "detection operation", but when the detection operation by the first detection electrode 21 is subsequently performed, the first operation may not be performed) is performed, a fourth operation, in which the fourth switch 14 is opened and then closed and further opened, and a fifth operation, in which the fifth switch 15 is opened and then closed and further opened, are alternately repeated to detect a capacitance of the second detection electrode 22 (the first operation is not repeated, and the fourth operation and the fifth operation are alternately repeated), that is, whether the detection object is in proximity is determined based on the value of the Vcs at this time.

That is, the detection object is detected according to the switching from the open state to the closed state of the first switch 11. As described above, when the failure determination of the first detection electrode 21 and the second detection electrode 22 is performed, the first operation, in which the first switch 11 is closed for the predetermined time and then opened, is also performed, but a time in which the second switch 12 is in the closed state during the failure determination of the first detection electrode 21 is set longer than a time in which the second switch 12 is in the closed state during the second operation. That is, the time of t2 to t3 and t3 to t4 required for the failure determination of the first detection electrode 21 in FIG. 2 is set longer than the time in which the second switch 12 is in the closed state during the "detection operation". Further, a time in which the fifth switch 15 is in the closed state during the failure determination of the first detection electrode 21 is set longer than a time in which the fifth switch 15 is in the closed state during the fifth operation. That is, the time of t3 to t4 required for the failure determination of the first detection electrode 21 in FIG. 2 is set longer than the time in which the fifth switch 15 is in the closed state during the "detection operation". Further, a time in which the fourth switch 14 is in the closed state during the failure determination of the second detection electrode 22 is set longer than a time in which the fourth switch 14 is in the closed state during the fourth operation. That is, the time of t6 to t7 and t7 to t8 required for the failure determination of the second detection electrode 22 in FIG. 2 is set longer than the time in which the fourth switch 14 is in the closed state during the "detection operation". Further, a time in which the third switch 13 is in the closed state during the failure determination of the second detection electrode 22 is set longer than a time in which the third switch 13 is in the closed state during the third operation. That is, the time of t7 to t8 required for the failure determination of the second detection electrode 22 in FIG. 2 is set longer than the time in which the third switch 13 is in the closed state during the "detection operation". Accordingly, since the electric charge of the capacitor Cs can be completely discharged during the failure determination, it is possible to perform the failure determination with high accuracy.

Other Embodiments

In the above embodiment, a case where the second detection electrode 22 is connected to the one terminal of the fifth switch 15 has been described, but the second detection electrode 22 may not be connected the to the one terminal of the fifth switch 15. Even with such a configuration, it is possible to perform the failure determination of the first detection electrode 21 and detect the detection object by the first detection electrode 21.

In the above embodiment, it has been described that the time in which the second switch 12 is in the closed state during the failure determination of the first detection electrode 21 is set longer than the time in which the second switch 12 is in the closed state during the second operation, and the time in which the fourth switch 14 is in the closed state during the failure determination of the second detection electrode 22 is set longer than the time in which the fourth switch 14 is in the closed state during the fourth operation, but the time in which the second switch 12 is in the closed state during the failure determination of the first detection electrode 21 and the time in which the fourth switch 14 is in the closed state during the failure determination of the second detection electrode 22 may be the same as or shorter than the time in which the second switch 12 is in the closed state during the second operation and the time in which the fourth switch 14 is in the closed state during the fourth operation, respectively.

This disclosure can be used in a capacitance sensor that detects proximity of a detection object based on a change in a capacitance.

A characteristic configuration of a capacitance sensor according to this disclosure resides in that the capacitance sensor is configured to detect proximity of a detection object based on a change in a capacitance between the detection object and a first detection electrode and a change in a capacitance between the detection object and a second detection electrode, the capacitance sensor including: a capacitor whose one terminal is applied with a preset first potential; a first switch provided over the one terminal and the other terminal of the capacitor; a second switch whose one terminal is connected to the other terminal of the capacitor; a third switch whose one terminal is connected to the other terminal of the second switch and the first detection electrode, and the other terminal is applied with a second potential lower than the first potential; a fourth switch whose one terminal is connected to the other terminal of the capacitor; a fifth switch whose one terminal is connectable to the second detection electrode and is connected to the other terminal of the fourth switch, and the other terminal is applied with the second potential; and a determination unit configured to determine a failure of at least the first detection electrode based on a potential difference between a potential of the other terminal of the capacitor and a reference potential set according to the first potential.

With such a characteristic configuration, the determination unit determines whether a failure occurs in the first detection electrode based on whether a current is flowing through the first detection electrode itself, so that it is possible to perform failure determination of the first detection electrode with high accuracy. Further, since the failure determination is performed using originally provided switches, it is not necessary to newly provide a switch for the failure determination. Therefore, the failure determination can be performed at low cost, and increase in the mounting area of components can be prevented. Further, since the failure determination is performed based on an opening and closing operation of a switch to be performed when the detection object is detected, convenience is high.

It is preferable that the determination unit is configured to determine whether the first detection electrode is in a short-circuited state based on a potential of the other terminal of the capacitor when the first switch is opened after being in a closed state for a predetermined time, and then the second switch is closed while the fifth switch is in an open state.

With such a configuration, it is possible to determine whether the first detection electrode is in a short-circuited state by using the second switch to be used when the first detection electrode detects the detection object, so that it is not necessary to newly provide a switch. Therefore, the failure determination can be implemented at low cost.

It is preferable that the determination unit is configured to determine whether the first detection electrode is in an open state based on a potential of the other terminal of the capacitor when the first switch is opened after being in a closed state for a predetermined time, and then both the second switch and the fifth switch are closed.

With such a configuration, it is possible to determine whether the first detection electrode is in an open state by using the second switch to be used when the first detection electrode detects the detection object and the fifth switch to be used when the second detection electrode detects the detection object, so that it is not necessary to newly provide a switch. Therefore, the failure determination can be implemented at low cost.

It is preferable that, in a case where the second detection electrode is connected to the one terminal of the fifth switch, the determination unit determines whether the second detection electrode is in a short-circuited state based on a potential of the other terminal of the capacitor when the first switch is opened after being in a closed state for a predetermined time, and then the fourth switch is closed while the third switch is in an open state.

With such a configuration, it is possible to determine whether the second detection electrode is in a short-circuited state by using the fourth switch to be used when the second detection electrode detects the detection object, so that it is not necessary to newly provide a switch. Therefore, the failure determination can be implemented at low cost.

It is preferable that, in a case where the second detection electrode is connected to the one terminal of the fifth switch, the determination unit determines whether the second detection electrode is in an open state based on a potential of the other terminal of the capacitor when the first switch is opened after being in a closed state for a predetermined time, and then both the third switch and the fourth switch are closed.

With such a configuration, it is possible to determine whether the second detection electrode is in an open state by using the third switch to be used when the first detection electrode detects the detection object and the fourth switch to be used when the second detection electrode detects the detection object, so that it is not necessary to newly provide a switch. Therefore, the failure determination can be implemented at low cost.

It is preferable that, after failure determination of the first detection electrode is performed, a capacitance of the first detection electrode is detected by performing a first operation in which the first switch is opened after being in a closed state for a predetermined time, and then alternately repeating a second operation in which the second switch is opened and then closed and further opened, and a third operation in which the third switch is opened and then closed and further opened.

With such a configuration, after the failure determination of the first detection electrode is performed, a detection operation for the detection object by the first detection electrode can be performed.

It is preferable that the determination unit is configured to determine a failure of the second detection electrode in a case where the second detection electrode is connected to the one terminal of the fifth switch, and after failure determination of the second detection electrode is performed, a capacitance of the second detection electrode is detected by performing a first operation in which the first switch is opened after being in a closed state for a predetermined time, and alternately repeating a fourth operation in which the fourth switch is opened and then closed and further opened, and a fifth operation in which the fifth switch is opened and then closed and further opened.

With such a configuration, after the failure determination of the second detection electrode is performed, a detection operation for the detection object by the second detection electrode can be performed.

It is preferable that a time in which the second switch is in the closed state during the failure determination of the first detection electrode is set longer than a time in which the second switch is in the closed state during the second operation.

With such a configuration, electric charge of the capacitor can be completely discharged during the failure determination of the first detection electrode, so that it is possible to perform the failure determination with high accuracy.

It is preferable that a time in which the fourth switch is in the closed state during the failure determination of the second detection electrode is set longer than a time in which the fourth switch is in the closed state during the fourth operation.

With such a configuration, the electric charge of the capacitor can be completely discharged during the failure determination of the second detection electrode, so that it is possible to perform the failure determination with high accuracy.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A capacitance sensor configured to detect proximity of a detection object based on a change in a capacitance between the detection object and a first detection electrode and a change in a capacitance between the detection object and a second detection electrode, the capacitance sensor comprising:
    a capacitor whose one terminal is applied with a preset first potential;
    a first switch provided over the one terminal and the other terminal of the capacitor;
    a second switch whose one terminal is connected to the other terminal of the capacitor;
    a third switch whose one terminal is connected to the other terminal of the second switch and the first detection electrode, and the other terminal is applied with a second potential lower than the first potential;
    a fourth switch whose one terminal is connected to the other terminal of the capacitor;
    a fifth switch whose one terminal is connectable to the second detection electrode and is connected to the other terminal of the fourth switch, and the other terminal is applied with the second potential; and
    a determination unit configured to determine a failure of at least the first detection electrode based on a potential difference between a potential of the other terminal of the capacitor and a reference potential set according to the first potential.

2. The capacitance sensor according to claim 1, wherein the determination unit is configured to determine whether the first detection electrode is in a short-circuited state based on a potential of the other terminal of the capacitor when the first switch is opened after being in a closed state for a predetermined time, and then the second switch is closed while the fifth switch is in an open state.

3. The capacitance sensor according to claim 1, wherein the determination unit is configured to determine whether the first detection electrode is in an open state based on a potential of the other terminal of the capacitor when the first switch is opened after being in a closed state for a predetermined time, and then both the second switch and the fifth switch are closed.

4. The capacitance sensor according to claim 1, wherein in a case where the second detection electrode is connected to the one terminal of the fifth switch, the determination unit determines whether the second detection electrode is in a short-circuited state based on a potential of the other terminal of the capacitor when the first switch is opened after being in a closed state for a predetermined time, and then the fourth switch is closed while the third switch is in an open state.

5. The capacitance sensor according to claim 1, wherein in a case where the second detection electrode is connected to the one terminal of the fifth switch, the determination unit determines whether the second detection electrode is in an open state based on a potential of the other terminal of the capacitor when the first switch is opened after being in a closed state for a predetermined time, and then both the third switch and the fourth switch are closed.

6. The capacitance sensor according to claim 1, wherein after failure determination of the first detection electrode is performed, a capacitance of the first detection electrode is detected by performing a first operation in which the first switch is opened after being in a closed state for a predetermined time, and then alternately repeating a second operation in which the second switch is opened and then closed and further opened, and a third operation in which the third switch is opened and then closed and further opened.

7. The capacitance sensor according to claim 6, wherein the determination unit is configured to determine a failure of the second detection electrode in a case where the second detection electrode is connected to the one terminal of the fifth switch, and after failure determination of the second detection electrode is performed, a capacitance of the second detection electrode is detected by performing a first operation in which the first switch is opened after being in a closed state for a predetermined time, and alternately repeating a fourth operation in which the fourth switch is opened and then closed and further opened, and a fifth operation in which the fifth switch is opened and then closed and further opened.

8. The capacitance sensor according to claim 6, wherein
a time in which the second switch is in the closed state during the failure determination of the first detection electrode is set longer than a time in which the second switch is in the closed state during the second operation.

9. The capacitance sensor according to claim 7, wherein
a time in which the fourth switch is in the closed state during the failure determination of the second detection electrode is set longer than a time in which the fourth switch is in the closed state during the fourth operation.

\* \* \* \* \*